(12) United States Patent
Tan et al.

(10) Patent No.: US 6,252,896 B1
(45) Date of Patent: Jun. 26, 2001

(54) LONG-WAVELENGTH VCSEL USING BURIED BRAGG REFLECTORS

(75) Inventors: Michael R. T. Tan, Menlo Park; Dubravko I. Babic; Scott W. Corzine, both of Sunnyvale; Tirmula R. Ranganath; Shih-Yuan Wang, both of Palo Alto; Wayne Bi, Fremont, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/263,696

(22) Filed: Mar. 5, 1999

(51) Int. Cl.$^7$ ................................ H01S 5/00; H01S 3/091

(52) U.S. Cl. .................................. 372/50; 372/75

(58) Field of Search .................... 372/50, 96, 75, 372/43

(56) References Cited

U.S. PATENT DOCUMENTS

| | | | |
|---|---|---|---|
| 5,363,390 | * 11/1994 | Yang et al. | 372/45 |
| 5,513,204 | 4/1996 | Jayaraman | 372/96 |
| 5,754,578 | 5/1998 | Jayaraman | 372/50 |

OTHER PUBLICATIONS

V. Jayaraman et al., "Uniform threshold current, continous–wave, singlemode 1300nm vertical cavity lasers from 0 to 70°C," *Electronic Letters*, vol. 34, No. 14, Jul. 9, 1998, pp. 1405–1407.

* cited by examiner

Primary Examiner—Quyen P. Leung (57) ABSTRACT

An optically pumped vertical-cavity surface-emitting laser (VCSEL) device and a method of fabricating the device utilize two separate substrates that perform a filtering operation to selectively transmit only light having a long peak wavelength that is generated by the device. The optically pumped VCSEL device is a self-pumped device that can generate the pump light to drive the device to emit output laser light having a long peak wavelength. The optically pumped VCSEL device includes a short-wavelength VCSEL formed on one of the two substrates and a long-wavelength VCSEL formed on the other substrate. The short-wavelength VCSEL is a current-driven VCSEL that generates short-wavelength light to drive (i.e., optically pump) the long-wavelength VCSEL. The short-wavelength VCSEL and the long-wavelength VCSEL are bonded together such that the two substrates are separated by the two VCSELs. A transparent optical adhesive material or a metallic bonding material may be utilized to bond the short-wavelength VCSEL onto the long-wavelength VCSEL. The substrates are wavelength-selective with respect to propagating light, so that short-wavelength light generated by the short-wavelength VCSEL and not absorbed by the long-wavelength VCSEL is mostly absorbed by the two separate substrates. However, the long-wavelength light generated by the long-wavelength VCSEL is allowed to be transmitted through the substrates as output laser light.

18 Claims, 5 Drawing Sheets

produced from the long-wavelength VCSEL 12.

LONG-WAVELENGTH VCSEL USING BURIED BRAGG REFLECTORS

TECHNICAL FIELD

The invention relates generally to vertical-cavity surface-emitting lasers and more particularly to an optically pumped vertical-cavity surface-emitting laser.

DESCRIPTION OF THE RELATED ART

Vertical-cavity surface-emitting lasers (VCSELs) have a number of advantages over traditional edge-emitting lasers, such as low manufacturing cost, good beam quality and scalable geometries. These properties make VCSELs desirable for many applications. In particular, VCSELs that can produce long wavelength light (1300 nm–1550 nm) are of interest in optical communications.

A VCSEL may be driven by electrical current or may be optically pumped to produce the output laser light. A conventional current-injection VCSEL includes an active region that is positioned between two distributed Bragg reflectors (DBRs) that are formed on a substrate. In addition, the current-injection VCSEL includes two ohmic contacts for applying electrical current to the active region. Typically, one of the ohmic contacts is located below the substrate, while the other ohmic contact is located above the top DBR. When voltage is applied to the contacts, electrical current is injected into the active region, causing the active region to emit light. The emitted light is reflected between the two DBRs. A portion of the emitted light may propagate through the top DBR or the bottom DBR as the output laser light.

A conventional optically pumped VCSEL also includes an active region between two DBRs. However, the optically pumped VCSEL includes, or is operationally associated with, a light source. The light source may be another VCSEL or a light-emitting diode. The optically pumped VCSEL generates the output laser light by absorbing "pump light" supplied by the light source. The pump light is absorbed by the active region, which causes emission of the output laser light.

Figure 1:
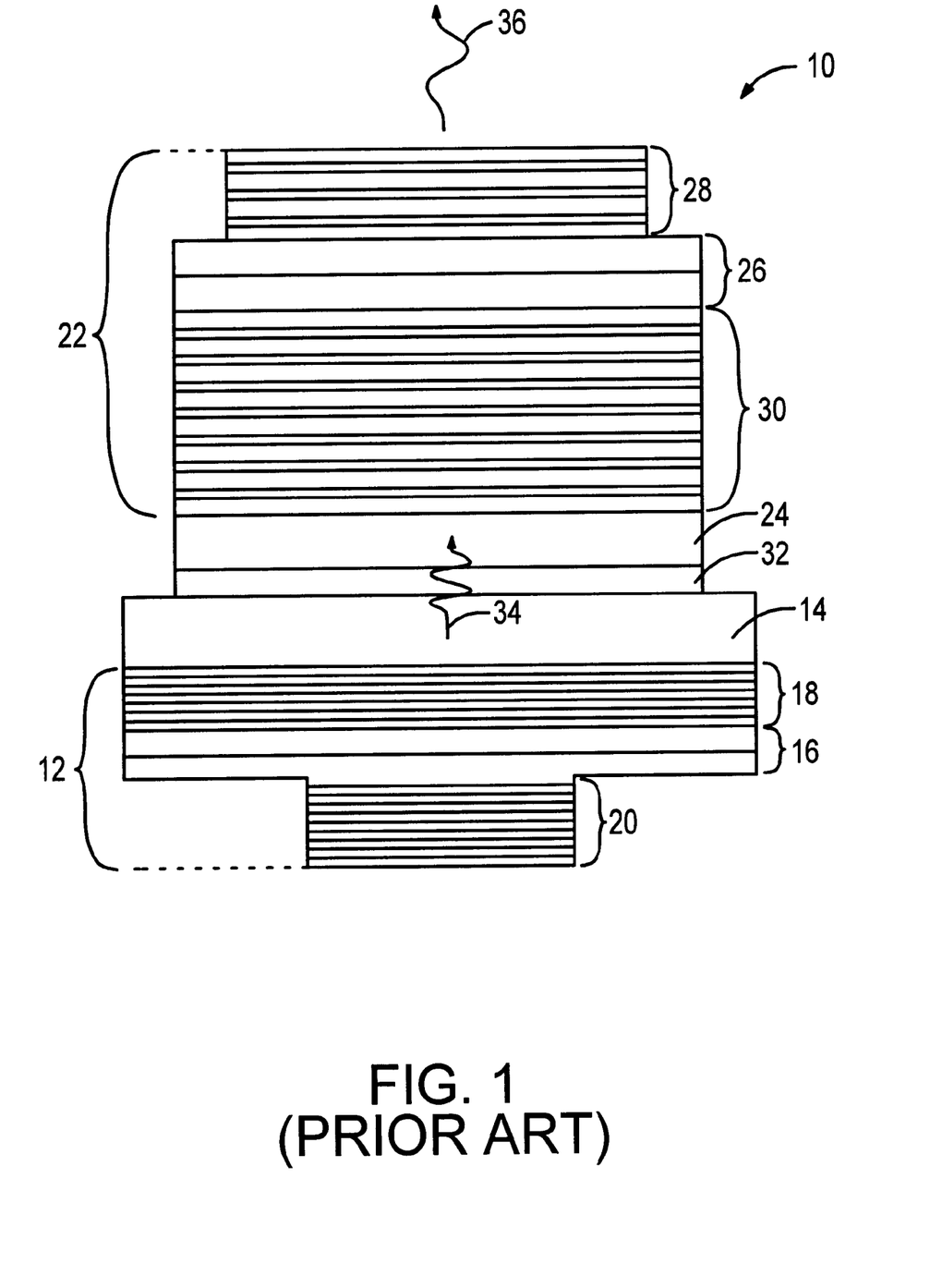
FIG. 1 is a schematic illustration of a first prior art optically pumped VCSEL device having two substrates.

U.S. Pat. No. 5,513,204 to Jayaraman describes an optically pumped VCSEL device that includes a short-wavelength VCSEL that optically pumps a long-wavelength VCSEL that is coupled to the short-wavelength VCSEL. One embodiment of the optically pumped VCSEL device of Jayaraman is shown in FIG. 1. In this embodiment, a VCSEL device 10 includes a short-wavelength VCSEL 12 that is formed on a GaAs substrate 14. The short-wavelength VCSEL 12 is comprised of an active region 16 and mirrors 18 and 20. The VCSEL device 10 also includes a long-wavelength VCSEL 22 formed on a GaAs substrate 24. The long-wavelength VCSEL 22 is comprised of an active region 26 and mirrors 28 and 30. The mirror 28 is made of alternating layers of GaAs and AlAs, while the mirror 30 is made of alternating layers of $SiO_2$ and $TiO_2$. The long-wavelength VCSEL 22 is coupled to the short-wavelength VCSEL 12 by a layer 32 of adhesive material. The adhesive material may be a transparent optical adhesive material or a metallic bonding material. In an alternative embodiment, the VCSELs 12 and 22 are fusion bonded to form a monolithic structure.

In operation, the short-wavelength VCSEL 12 is initially activated to emit light 34 having a short peak wavelength. The activation of the VCSEL 12 involves injecting current into the active region 16 via ohmic contacts (not shown). The light 34 propagates through the mirror 30 of the long-wavelength VCSEL 22 and impinges upon the active region 26. The light 34 is absorbed by the active region 26, which gives rise to electron-hole pairs. These pairs collect in the quantum wells within the active region 26 where they recombine, producing laser light 36 having a long peak wave-length. The laser light 36 exits the VCSEL device 10 as output laser light from the mirror 28 of the long-wavelength VCSEL 22.

A concern with the VCSEL device 10 is that a significant portion of the light 34 from the short-wavelength VCSEL 12 that was pumped to the long-wavelength VCSEL 22 will be transmitted along with the laser light 36. Ideally, the output laser light will contain only the long-wavelength laser light 36 produced from the long-wavelength VCSEL 12. However, when the short-wavelength light 34 reaches the active region 26 of the short-wavelength VCSEL 22, some of the short-wavelength light 34 will not be absorbed by the active region 26 and will be transmitted through the mirror 28. The mirror 28 can be designed to reflect the short-wavelength light 34. However, it is inevitable that some of the short-wavelength light 34 will be transmitted through the mirror 28 along with the laser light 36 as part of the output laser light. When the VCSEL device 10 is coupled to a fiber optic cable, a filtering device may be required to selectively transmit only the long-wavelength laser light 36 from the VCSEL device 10, which would add complexity and cost to the system that will embody the VCSEL device 10.

Figure 2:
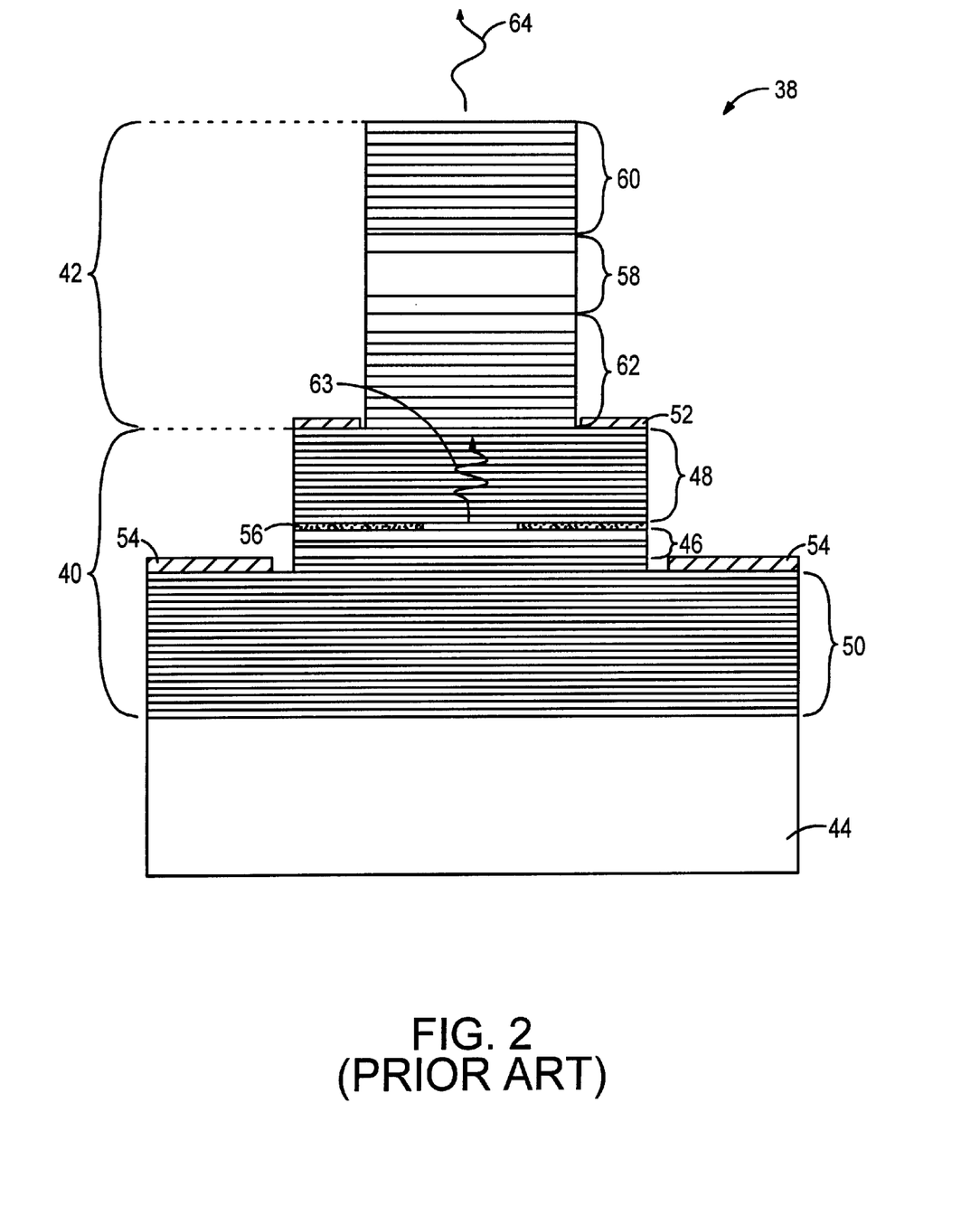
FIG. 2 is a schematic illustration of a second prior art optically pumped VCSEL device having a single substrate.

Another optically pumped VCSEL device of interest is described in U.S. Pat. No. 5,754,578, which is also issued to Jayaraman. One embodiment of the optically pumped VCSEL device disclosed in this patent is illustrated in FIG. 2. In this embodiment, a VCSEL device 38 includes a short-wavelength VCSEL 40 and a long-wavelength VCSEL 42 that are formed on a single GaAs substrate 44. The short-wavelength VCSEL 40 is comprised of an active region 46 and mirrors 48 and 50. The mirrors 48 and 50 are made of alternating layers of GaAs and AlGaAs. The short-wavelength VCSEL 40 includes metal contacts 52 and 54 that provide current to the activation layer 46. In addition, the short-wavelength VCSEL 40 includes a current confining scheme which may be realized by proton implantation or by an oxidation layer 56. The long-wavelength VCSEL 42 is comprised of an active region 58 and mirrors 60 and 62. The mirror 62 is made of alternating layers of GaAs and AlGaAs. However, the mirror 60 can be made of a number of different materials suitable for fabricating a mirror in a VCSEL. The mirror 62 is described as being grown in the same epitaxial growth step as the short-wavelength VCSEL 40.

The operation of the VCSEL device 38 is virtually identical to the operation of the VCSEL device 10 of FIG. 1. Initially, current is injected into the active region 46 of the short-wavelength VCSEL 40 via the contacts 52 and 54. The injected current drives the active region 46 such that light 63 having a short peak wavelength is emitted from the short-wavelength VCSEL 40. The light 63 then propagates through the mirror 62 of the long-wavelength VCSEL 42 and impinges upon the active region 58. The light 63 is absorbed by the active region 58, which drives the active region 58 to emit laser light 64 having a long peak wave-length. The laser light 64 exits the VCSEL device 38 as output laser light from the mirror 60 of the long-wavelength VCSEL 38.

The same concern of the VCSEL 10 of FIG. 1 exists for the VCSEL device 38 of FIG. 2. Namely, the output laser light from the VCSEL device 38 will contain a significant amount of the short-wavelength light 63 emitted from the short VCSEL 40. Again, a costly filtering device may be required to filter the short-wavelength light 63 and transmit only the laser light 64.

What is needed is an optically pumped VCSEL device that can efficiently output laser light having a long peak wavelength without a need for an external filter.

SUMMARY OF THE INVENTION

An optically pumped vertical-cavity surface-emitting laser (VCSEL) device and a method of fabricating the device utilize two separate substrates that perform a filtering operation to selectively transmit only light having a long peak wavelength that is generated by the device. The optically pumped VCSEL device is a self-pumped device that can generate the pump light to drive the device to emit output laser light having a long peak wavelength. Preferably, the output laser light has a peak wavelength between 1300 nm and 1550 nm, which is desirable for applications in the field of optical communications.

The optically pumped VCSEL device includes two VCSELs that are independently formed on the two separate substrates. One of the two VCSELs is a current-driven short-wavelength VCSEL, while the other VCSEL is an optically pumped long-wavelength VCSEL. The short-wavelength VCSEL provides the light that is utilized to optically pump the long-wavelength VCSEL. Preferably, the long-wavelength VCSEL is configured to emit light having a peak wavelength between 1250 nm and 1700 nm, while the short-wavelength VCSEL is configured to emit light having a peak wavelength of less than 920 nm, with 850 nm being most preferred.

The short-wavelength VCSEL includes an active region and two distributed Bragg reflector (DBR) mirrors that are formed on one of the two separate substrates. The short-wavelength VCSEL may be a conventional VCSEL that is commercially available. The substrate in which the short-wavelength VCSEL is formed can be a GaAs substrate. The two DBR mirrors may be semiconductor mirrors comprised of materials that are typically utilized to fabricate a short-wavelength VCSEL. As an example, each of the two semiconductor mirrors may be alternating layers of AlGaAs having a low refractive index and AlGaAs having a high refractive index. The active region may include GaAs quantum wells.

The long-wavelength VCSEL includes an active region and two DBR mirrors that are formed on the other substrate. The substrate in which the long-wavelength VCSEL is formed can be an InP substrate. One of the two DBR mirrors of the long-wavelength VCSEL may be a semiconductor mirror, while the other mirror may be a dielectric mirror. As an example, the dielectric DBR mirror may be made of alternating layers of $SiO_2$ and $TiO_2$. In addition, the semiconductor DBR mirror may be made of alternating layers of InGaArP and InP, or alternating layers of InGaAlAs and AlInP or InP. The active region may include InGaAsP or AlInGaAs quantum wells. The materials utilized to fabricate the components of the long-wavelength VCSEL are not critical to the invention.

The long-wavelength VCSEL and the short-wavelength VCSEL are bonded together to form the optically pumped VCSEL device. The two VCSELs are attached such that the two substrates are separated by the active regions and mirrors of two VCSELs. A transparent optical adhesive material or a metallic bonding material may be utilized to bond the short-wavelength VCSEL onto the long-wavelength VCSEL. However, the type of bonding material utilized to couple the two VCSELs is not critical to the invention.

The optically pumped VCSEL device can be a top-emitting device or a bottom-emitting device. Preferably, the optically pumped VCSEL device is a top-emitting device having the long-wavelength VCSEL located above the short-wavelength VCSEL. In operation, the short-wavelength VCSEL is initially activated by applying voltage across the active region of the short-wavelength VCSEL, thereby injecting current into the active region. The current injection induces the active region to emit first light having a short peak wavelength. The emitted first light propagates in an upward direction and in a downward direction. The first light propagating in the downward direction is absorbed by the substrate on which the short-wavelength VCSEL has been formed. The first light propagating in the upward direction impinges upon the active region of the long-wavelength VCSEL. Much of the first light is then absorbed by the active region of the long-wavelength VCSEL.

The absorption of the first light drives (i.e., optically pumps) the active region of the long-wavelength VCSEL to emit second light having a long peak wavelength. The second light is emitted in upward and downward directions. The second light propagating in the upward direction travels through the substrate on which the long-wavelength VCSEL has been formed and escapes the optically pumped VCSEL device as output laser light. However, a high percentage of any of the first light that propagates through the long-wavelength VCSEL is absorbed by the same substrate that allowed the second light to pass. Therefore, the output laser light does not contain a significant amount of the first light having the short peak wavelength. The second light propagating in the downward direction travels through the short-wavelength VCSEL and the substrate on which the short-wavelength VCSEL has been formed, thereby exiting the optically pumped VCSEL device. A photodiode may be placed below the substrate on which the short-wavelength VCSEL has been formed to monitor the second light emitted by the long-wavelength VCSEL. Since the first light is mostly absorbed by the short-wavelength substrate, the photodiode will essentially be receiving only the second light having the long peak wavelength.

The method of fabricating an optically pumped VCSEL device in accordance with the present invention includes a step in which a short-wavelength VCSEL is formed on a first substrate. A long-wavelength VCSEL is independently formed on a second substrate. The short-wavelength VCSEL is then directly bonded onto the long-wavelength VCSEL, such that the first and second substrates are separated by the short-wavelength and long-wavelength VCSELs. A transparent optical adhesive material or a metallic bonding material may be utilized to bond the short-wavelength VCSEL onto the long-wavelength VCSEL. Preferably, flip-chip techniques are used for the bonding step. The method may include an optional step in which the long-wavelength VCSEL is positioned at an angle with respect to the short-wavelength VCSEL, such that a planar surface of the long-wavelength VCSEL and an opposing planar surface of the short-wavelength VCSEL produce the angle, prior to the bonding step.

A one-dimensional array or a two-dimensional array of optically pumped VCSEL devices may also be fabricated by bonding an array of long-wavelength VCSELs formed on an InP wafer to an array of short-wavelength VCSELs formed on a GaAs wafer. Furthermore, wavelength division multiplexing (WDM) arrays may be fabricated in a similar manner. The fabrication of the WDM array may be accomplished by configuring the array of long-wavelength VCSELs such that each long-wavelength VCSEL on the array of long-wavelength VCSELs is able to generate light having a specified peak wavelength from a selection of wavelengths. The number of different peak wavelengths may vary, depending on the specification of the equipment in which the WDM arrays will be embodied. The wavelength variation on the array of long-wavelength VCSELs can be realized by selective-area growth on the InP wafer to develop the long-wavelength VCSELs that can generate light having different peak wavelengths.

An advantage of the invention is that the two separate substrates absorb almost all of the short-wavelength light emitted by the short-wavelength VCSEL. Therefore, the output laser light is essentially comprised of only the long-wavelength light emitted by the long-wavelength VCSEL. The absorption of the short-wavelength light eliminates the need to place a filtering device to filter the short-wavelength light from the output laser light.

Another advantage is that since the short-wavelength light does not have to propagate through a substrate to reach the long-wavelength VCSEL, much of the short-wavelength light propagating in a direction toward the long-wavelength VCSEL will reach the long-wavelength VCSEL. Therefore, the light-generating efficiency of the long-wavelength VCSEL is not reduced.

DETAILED DESCRIPTION

Figure 3:
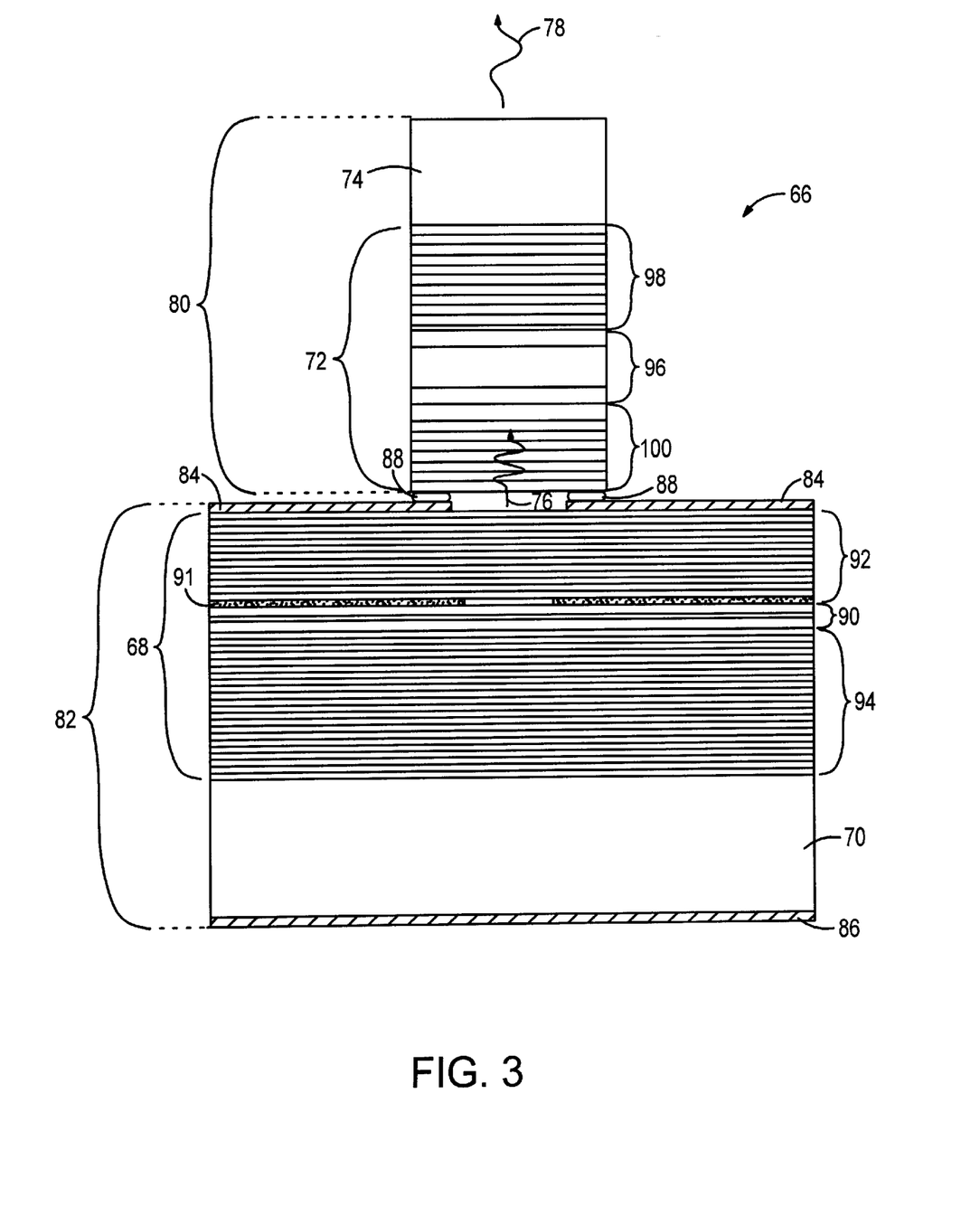
FIG. 3 is a schematic illustration of an optically pumped VCSEL device in accordance with the present invention.

With reference to FIG. 3, an optically pumped vertical-cavity surface-emitting laser (VCSEL) device 66 in accordance with the present invention is shown. The VCSEL device 66 may be embodied in a telecommunications system (not shown) to transmit optical data. The VCSEL device 66 includes a short-wavelength VCSEL 68 formed on a substrate 70 and a long-wavelength VCSEL 72 formed on a substrate 74. Preferably, the substrate 74 is an InP substrate, while the substrate 70 is a semiconductive GaAs substrate, but both substrates may be GaAs without departing from the concept of the invention. The short-wavelength VCSEL 68 is designed to emit light 76 having a short peak wavelength in response to current injection. The long-wavelength VCSEL 72 is designed to emit light 78 having a long peak wavelength in response to absorption of the short-wavelength light 76. Therefore, the short-wavelength VCSEL 68 drives the long-wavelength VCSEL 72 by emitting the short-wavelength light 76 which optically pumps the long-wavelength VCSEL 72. Preferably, the short-wavelength light 76 has a peak wavelength at 850 nm and the long-wavelength light 78 has a peak wavelength between 1250 nm and 1700 nm.

The VCSEL device 66 is not a monolithic structure. The VCSEL device 66 is made of two separate structures 80 and 82 that have been bonded together. The upper structure 80 includes the long-wavelength VCSEL 72 and the substrate 74. The lower structure 82 includes contact layers 84 and 86, the short-wavelength VCSEL 68 and the substrate 70. The long-wavelength VCSEL 72 and the short-wavelength VCSEL 68 are adjacently positioned such that the substrates 70 and 74 are separated by the VCSELs 68 and 72. The two structures 80 and 82 are bonded by an adhesive material 88. The adhesive material 88 may be a transparent optical adhesive material or a metallic bonding material. The bonding of the structures 80 and 82 is preferably accomplished at a low temperature to ensure that the VCSELs 68 and 72 are not damaged during the bonding process.

The short-wavelength VCSEL 68 of the structure 82 is comprised of an active region 90 and a current-confining oxidation layer 91 that are sandwiched between mirrors 92 and 94. The mirrors 92 and 94 are made of materials typically utilized to fabricate conventional short-wavelength VCSELs. Preferably, the mirrors 92 and 94 are semiconductor distributed Bragg reflectors (DBRs). As an example, the mirrors 92 and 94 may be made of alternating layers of a low refractive index AlGaAs and a high refractive index AlGaAs. The difference in refractive indices is caused by a difference in the percentage of Al content in the layers. The active region 90 includes GaAs quantum wells (not shown). The contact layers 84 and 86 that define the upper and lower surfaces of the structure 82 are made of a metallic material, such as aluminum-germanium-nickel alloy.

The light-emitting operation of the short-wavelength VCSEL 68 begins when voltage is applied to the contact layers 84 and 86. The applied voltage causes current to be injected into the active region 90, causing the quantum wells of the active region 90 to radiate light energy. The radiant light energy is reflected between the mirrors 92 and 94. Some of the radiant light energy escapes the cavity defined by the mirrors 92 and 94 as the short-wavelength light 76, which is propagating toward the long-wavelength VCSEL 72. However, some of the radiant light energy escapes the cavity as light having the same wavelength as the light 76 in the direction of the substrate 70. This light is eventually absorbed by the substrate 70. The properties of the substrate 70 are such that light having a wavelength of approximately 850 nm or shorter will be absorbed by the substrate.

The long-wavelength VCSEL 72 of the upper structure 80 is comprised of an active region 96 located between mirrors 98 and 100. The mirror 98 is a semiconductor DBR, while the mirror 100 is a dielectric DBR. The semiconductor DBR mirror 98 may be made of alternating layers of InGaArP and InP. In an alternative configuration, the mirror 98 may be made of alternating layers of InGaAlAs and InP or AlInP. The dielectric DBR mirror 100 may be made of alternating layers of $SiO_2$ and $TiO_2$, but other dielectric materials may be used. The active region 96 may include InGaAsP or AlInGaAs quantum wells (not shown). The materials utilized to fabricate the active region 96 and the mirrors 98 and 100 are not critical to the invention.

The long-wavelength VCSEL 72 operates to generate the long-wavelength light 78 by absorbing the short-wavelength light 76 emitted from the short-wavelength VCSEL 68. The emitted short-wavelength light 76 propagates through the bottom mirror 100 of the long-wavelength VCSEL 72 and is absorbed by the active region 96. The absorption of the short-wavelength light 76 by the active region 96 drives the active region 96 to emit long-wavelength light. Some of the emitted long-wavelength light propagates in an upward direction toward the substrate 74. However, some of the long-wavelength light is emitted by the active region 96 in a downward direction toward the short-wavelength VCSEL 68. This long-wavelength light propagates through the short-wavelength VCSEL 68 and the GaAs substrate 70. The downward propagating long-wavelength light eventually escapes the VCSEL device 66, exiting from the contact layer 86. Since the short-wavelength light emitted from the short-wavelength VCSEL 68 is absorbed by the substrate 70, the only light exiting the VCSEL 66 from the contact layer 86 is a portion of the long-wavelength light emitted from the long-wavelength VCSEL 72. Therefore, the intensity of the long-wavelength light generated by the long-wavelength VCSEL 72 may be monitored by placing a photodiode below the contact layer 86.

In the opposite direction, the long-wavelength light that is emitted in the upward direction toward the substrate 74 propagates through the mirror 98 and the substrate 74. The substrate 74 is configured to absorb light having a wavelength of approximately 920 nm or shorter. As previously noted, in the preferred embodiment, the short-wavelength light 76 emitted from the short-wavelength VCSEL 68 has a peak wavelength of 850 nm, while the long-wavelength light emitted from the long-wavelength VCSEL 72 has a peak wavelength between 1250 nm–1700 nm. Therefore, the short-wavelength light 76 will be absorbed by the substrate 74 and only the long-wavelength light 78 will be able to propagate through the substrate 74. The substrate 74, in effect, filters short-wavelength light 76 that propagates through the substrate 74, eliminating the need to have an external filter placed between the substrate 74 and an associated fiber optic cable (not shown).

Figure 5:
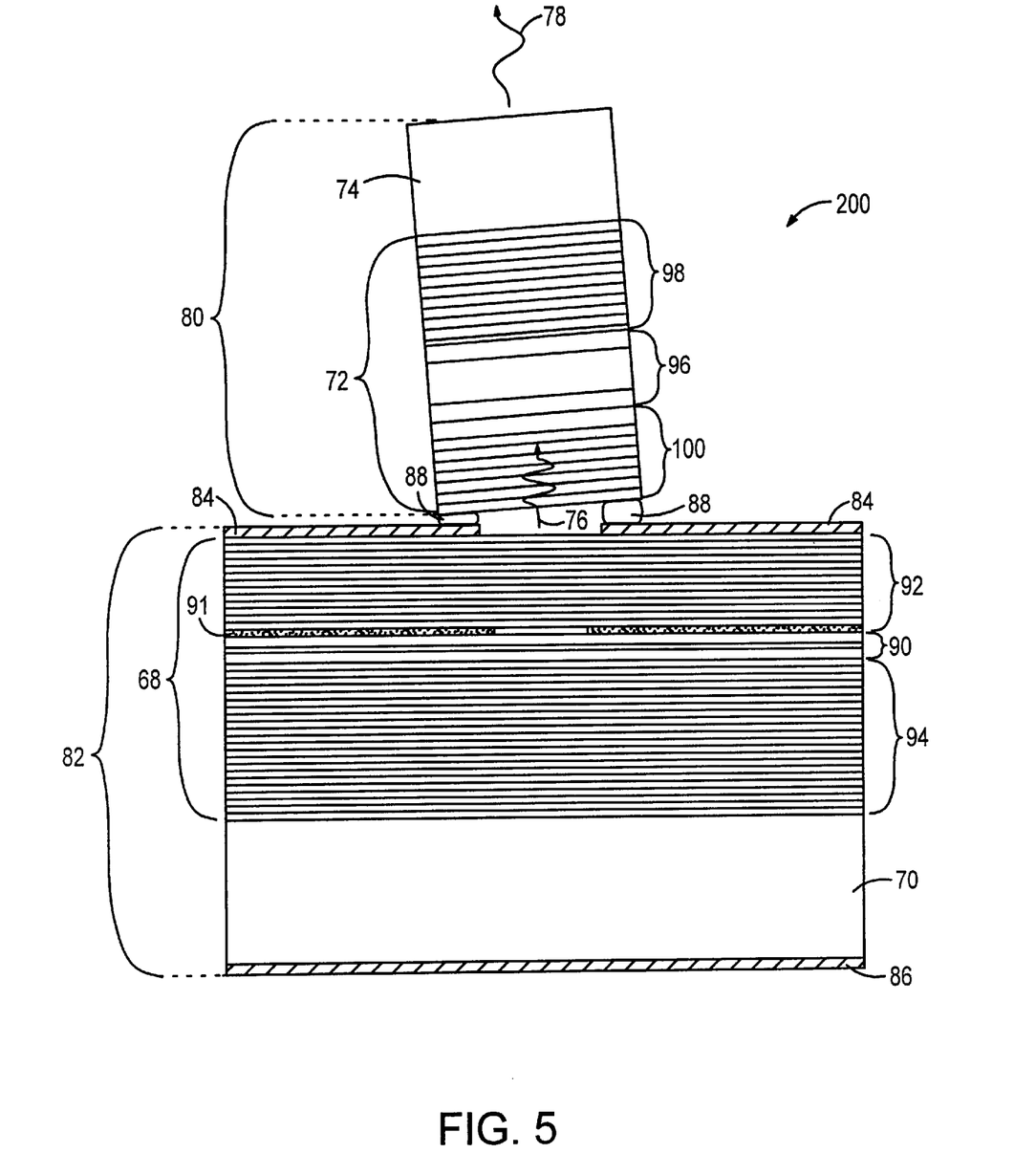
FIG. 5 is a schematic illustration of an optically pumped VCSEL device in accordance with an alternative embodiment of the present invention.

In an alternative embodiment of FIG. 5, an optically pumped VCSEL 200 is shown which includes the same reference numerals for repeated elements of FIG. 3. The upper structure 80 is tilted with respect to the planar surface of the lower structure 82. This may be achieved by increasing the thickness of the adhesive material 88 on one side of the upper structure 80. The tilting of the upper structure 80 creates an angle between the facing planar surfaces of the short-wavelength VCSEL 68 and the long-wavelength VCSEL 72. The angle prevents much of the short-wavelength light 76 that is reflected by the lower surface of the long-wavelength VCSEL 72 from being transmitted back into the short-wavelength VCSEL 68.

Figure 4:
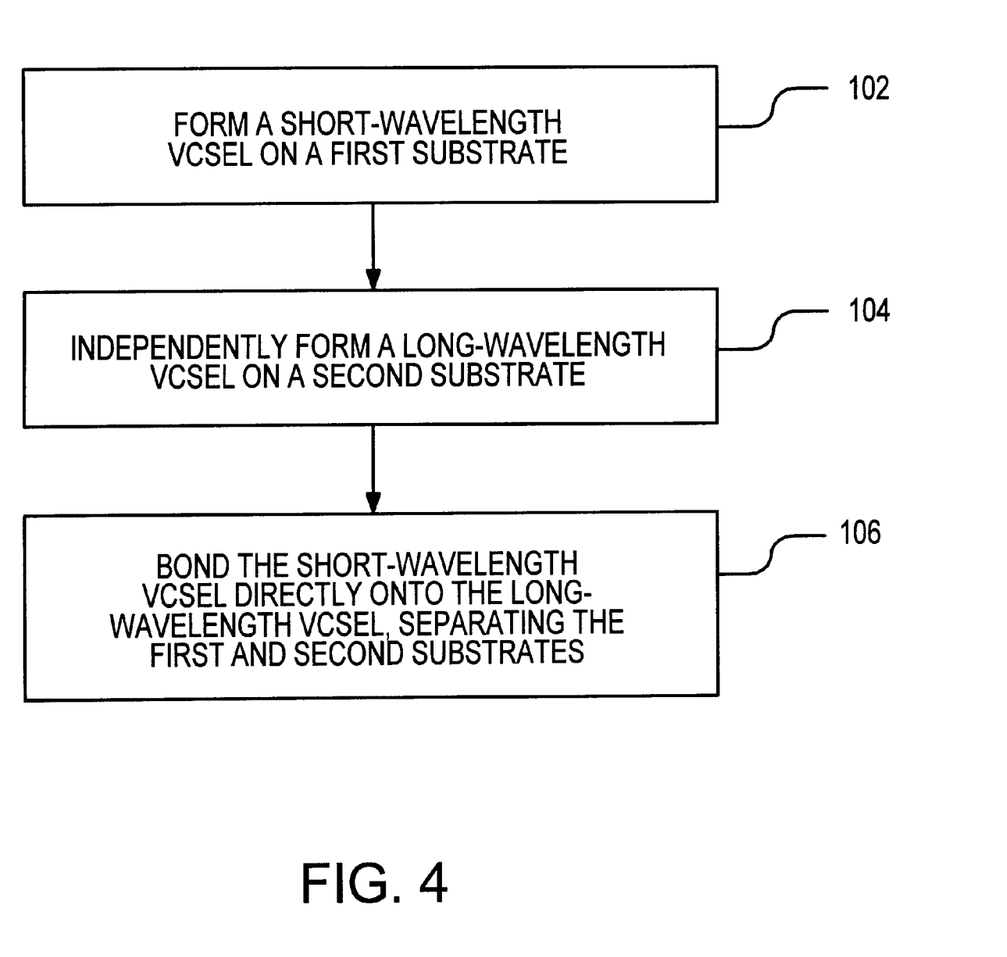
FIG. 4 is a flow diagram of a method of fabricating an optically pumped VCSEL device in accordance with the present invention.

A method of fabricating an optically pumped VCSEL device in accordance with the present invention will be described with reference to FIG. 4. At step 102, a short-wavelength VCSEL is formed on a first substrate. The short-wavelength VCSEL may be a conventional current-driven VCSEL. Preferably, the short-wavelength VCSEL is configured to emit light having a peak wavelength of 850 nm. Next, at step 104, a long-wavelength VCSEL is independently formed on a second substrate. Preferably, the long-wavelength VCSEL is configured to emit light having a peak wavelength between 1300 nm and 1550 nm, by absorbing the short-wavelength light emitted from the short-wavelength VCSEL. In the preferred embodiment, the first and second substrates have a common transmittance characteristic of absorbing the light emitted from the short-wavelength VCSEL, while allowing the light emitted from the long-wavelength VCSEL to be transmitted through the substrates. At step 106, the short-wavelength VCSEL is directly bonded onto the long-wavelength VCSEL, such that the first and second substrates are separated by the short-wavelength and long-wavelength VCSELs. A transparent optical adhesive material or a metallic bonding material may be utilized to bond the short-wavelength VCSEL onto the long-wavelength VCSEL. Preferably, flip-chip techniques are used for the bonding step. The method may include an optional step of positioning the long-wavelength VCSEL at an angle with respect to the short-wavelength VCSEL, such that a planar surface of the long-wavelength VCSEL and an opposing planar surface of the short-wavelength VCSEL produce the angle, prior to the step 106.

Although only a single VCSEL device is fabricated by the above method, a one-dimensional array or a two-dimensional array of optically pumped VCSEL devices, identical to the VCSEL device 66 of FIG. 3, may be fabricated by bonding an array of long-wavelength VCSELs formed on an InP wafer to an array of short-wavelength VCSELs formed on a GaAs wafer. Furthermore, a wavelength division multiplexing (WDM) array may be fabricated in a similar manner. The fabrication of the WDM array may be accomplished by configuring the array of long-wavelength VCSELs such that each long-wavelength VCSEL on the array of long-wavelength VCSELs is able to generate light having a specified peak wavelength from a selection of wavelengths. The number of different peak wavelengths may vary depending on the specification of the equipment in which the WDM arrays will be embodied. The wavelength variation on the array of long-wavelength VCSELs can be realized by selective-area growth on the InP wafer to develop the long-wavelength VCSELs that can generate light having different peak wavelengths.

What is claimed is:

1. A light-emitting device comprising:
a first light-generating structure that radiates first light of a first peak wavelength, said first light-generating structure being located on a first substrate; and
a second light-generating structure that radiates second light of a second peak wavelength, said second light-generating structure being located on a second substrate, said second light-generating structure being physically attached to said first light-generating structure such that said first and second light-generating structures are sandwiched between said first and second substrates, said second light-generating structure being optically coupled to said first light-generating structure to generate said second light of said second peak wavelength in response to said first light of said first peak wavelength;
wherein said first substrate and said second substrate have transmittance characteristics of absorbing said first light of said first Peak wavelength, while allowing said second light of said second peak wavelength to be transmitted through said first substrate and said second substrate, said first and second substrates thereby being wavelength-selective with respect to propagating light energy.

2. The device of claim 1 wherein said first substrate includes GaAs and said second substrate includes InP.

3. The device of claim 1 wherein said first light-generating structure defines a first vertical-cavity surface-emitting laser (VCSEL) and said second light-generating structure defines a second VCSEL.

4. The device of claim 3 wherein said second VCSEL includes a dielectric distributed Bragg reflector (DBR) and said second VCSEL includes a semiconductor DBR.

5. The device of claim 3 wherein said first VCSEL is configured to generate said first light having said first peak wavelength of less than 920 nm and said second VCSEL is configured to generate said first light having said peak wavelength between 1250 nm and 1700 nm.

6. The device of claim 1 wherein said second light-generating structure is angularly orientated with respect to said first light-generating structure such that a surface of said second layer stack facing said first layer stack is at an angle with an opposing surface of said first layer stack, said angle being greater than zero degrees and less than ninety degrees.

7. The device of claim 1 wherein said first light-generating structure is affixed to said second light-generating structure by an optical adhesive material, said optical adhesive material being transparent.

8. The device of claim 1 wherein said first light-generating structure is affixed to said second light-generating structure by a metallic bonding material, said metallic bonding material positioned to not appreciably limit an optical coupling between said first and second light-generating structures.

9. A method of fabricating an optically pumped light-emitting device comprising steps of:

forming a first light-emitting layer stack on a first substrate, said first light-emitting layer stack being a first vertical-cavity surface-emitting laser (VCSEL) and being current-activated to emit first light in a wavelength range having a first peak wavelength in response to an applied electrical signal;

independently forming a second light-emitting layer stack on a second substrate, said second light-emitting layer stack being a second VCSEL and being light-activated to emit second light in a wavelength range having a second peak wavelength in response to said first light; and placing in contact said first light-emitting layer stack with said second light-emitting layer stack such that said first substrate is separated from said second substrate by said first layer stack and said second layer stack.

10. The method of claim 9 wherein said step of placing in contact said first light-emitting layer stack onto said second light-emitting layer stack includes positioning said first light-emitting layer stack at an acute angle that is greater than zero degrees with respect to said second light-emitting layer stack such that a planar surface of said first light-emitting layer stack is at said angle relative to an opposing planar surface of said second light-emitting layer stack.

11. The method of claim 9 wherein said step of placing in contact said first light-emitting layer stack onto said second light-emitting layer stack includes utilizing an optical adhesive material to bond said first light-emitting layer stack and said second light-emitting layer stack together.

12. The method of claim 9 wherein said step of placing in contact said first light-emitting layer stack onto said second light-emitting layer stack includes utilizing a metallic bonding material to bond said first light-emitting layer stack and said second light-emitting layer stack together.

13. A laser device comprising:

a first light-generating structure having a short-wavelength vertical-cavity surface-emitting laser (VCSEL) on a first substrate, said first light-generating structure configured to emit first light in a wavelength range having a first peak wavelength in response to a current injection; and a second light-generating structure having a long-wavelength VCSEL on a second substrate affixed to said first light-generating structure such that said long-wavelength VCSEL is adjacent to said short-wavelength VCSEL resulting in separation of said first substrate and second substrate, said second VCSEL structure configured to emit second light in a wavelength range having a second peak wavelength by absorption of said first light.

14. The device of claim 13 wherein said first substrate of said first light-generating structure and said second substrate of said second light-generating structure are wavelength-selective, each of said first and second substrates having a transmittance characteristic such that said first light is absorbed by said first substrate and said second substrate, while said second light is allowed to be transmitted through said first substrate and second substrate.

15. The device of claim 13 wherein said short-wavelength VCSEL is configured to generate said first light having said first peak wavelength less than 920 nm and said long-wavelength VCSEL is configured to generate said first light having said peak wavelength between 1250 nm and 1700 nm.

16. The device of claim 13 wherein said second light-generating structure is angularly orientated with respect to said first light-generating structure such that opposing surfaces of said long-wavelength VCSEL and said short-wavelength VCSEL are non-parallel.

17. The device of claim 13 wherein said first light-generating structure is affixed to said second light-generating structure by an optical adhesive material, said optical adhesive material being transparent.

18. The device of claim 13 wherein said first light-generating structure is affixed to said second light-generating structure by a metallic bonding material.

* * * * *